(12) United States Patent
Tsuboi

(10) Patent No.: US 6,313,078 B1
(45) Date of Patent: Nov. 6, 2001

(54) CLEANING COMPOSITION FOR REMOVING RESIST AND METHOD OF REMOVING RESIST

(75) Inventor: Kenji Tsuboi, Oumihachiman (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/384,478

(22) Filed: Aug. 27, 1999

(30) Foreign Application Priority Data

Oct. 6, 1998 (JP) .................................................. 10-284182

(51) Int. Cl.⁷ ................................ C11D 1/22; C11D 3/43
(52) U.S. Cl. ........................ 510/175; 510/176; 510/421; 510/426; 510/437; 134/1.2; 134/1.3; 134/38; 134/40
(58) Field of Search ..................................... 510/175, 176, 510/421, 426, 637; 134/1.2, 1.3, 38, 40

(56) References Cited

U.S. PATENT DOCUMENTS

| | | | | |
|---|---|---|---|---|
| 3,930,857 | * | 1/1976 | Bendz et al. ........................... | 96/36.2 |
| 4,472,494 | * | 9/1984 | Hallman et al. ...................... | 430/160 |
| 4,861,438 | * | 8/1989 | Banks et al. ........................... | 204/15 |
| 5,753,601 | * | 5/1998 | Ward et al. ........................... | 510/176 |

* cited by examiner

Primary Examiner—Mark Kopec
Assistant Examiner—Charles Boyer
(74) Attorney, Agent, or Firm—Steven Capella

(57) ABSTRACT

A cleaning composition which includes a surfactant containing a phenyl group, a sulfonated aromatic compound, and water is prepared. The cleaning composition is especially useful for effectively removing deposited contaminants adhered mainly to a resist developing apparatus. Further, a derivative of aliphatic carboxylic acid and/or acetic ester can be added to the composition, as required. The cleaning composition is used mainly to clean a resist developing apparatus.

7 Claims, 1 Drawing Sheet

CLEANING COMPOSITION FOR REMOVING RESIST AND METHOD OF REMOVING RESIST

FIELD OF THE INVENTION

The present invention relates to a cleaning composition and a cleaning method using the same. More particularly, the present invention relates to an excellent cleaning composition that can remove in a short period of time deposited contaminant adhered to the interior of a resist developing apparatus which may be used for the production of electronic components or the like.

BACKGROUND OF THE INVENTION

In production of wiring, electrodes, or various components of electrical and electronic devices, a photo lithography technique is widely used to transfer a desired pattern to a thin resist film on a substrate or board.

Recently, with the higher integration of substrate circuits, the need for higher resolution resist has increased. However, since high resolution resist usually includes a highly hydrophobic photo initiator, such photo initiator insoluble in alkaline solution is prone to precipitate and adhere to a resist developing apparatus. An operation of a resist developing apparatus in the presence of such precipitates, or deposited contaminant, may cause underdevelopment due to clogging of splay nozzles, or product defects such as open or short circuit. Such deposited contaminants should be removed regularly to maintain a developing efficiency and a good condition for resist developement.

Conventionally, physical cleaning methods are employed to remove deposited contaminants adhered to a resist developing apparatus. Such physical methods include scrubbing off deposited contaminants, or washing off deposited contaminants with a high pressure spray, after components of a resist developing apparatus are demounted. However, it is difficult to remove deposited contaminants in corners of a chamber or components, inside of a pipe, inside of spray nozzles and the like completely by such physical methods.

Chemical cleaning methods using a cleaning agent are also employed, without using physical cleaning methods. For example, in a method using concentrated acetic acid, a concentrated acetic acid solution is introduced to be circulated in a tank for reserving developing solution. Unlike physical cleaning methods, this chemical method does not require a step of disassembling components of a resist developing apparatus to be cleaned and makes it possible to remove contaminants in complicated portions of a resist developing apparatus. However, acetic acid is only used under carefully controlled and limited situations, since irritating smell of acetic acid exerts a bad influence on the operating condition and the environment outside an operating room, and also acetic acid is corrosive to a resist developing apparatus.

Another chemical method wherein a resist developing apparatus is cleaned stepwise with two kinds of liquid is also used, however, it is not as effective as the acetic acid method. Therefore, concentrated acetic acid is used to clean a resist developing apparatus in spite of its bad influence on the environment and a resist developing apparatus, or a substitute that is not as effective as acetic acid is used.

SUMMARY OF THE INVENTION

The present inventor made researches to solve the above problems and to provide a cleaning composition which can be used to remove deposited contaminant adhered to a resist developing apparatus and eventually achieved the present invention.

An object of the present invention is to provide a cleaning or detergent composition which is suitable to clean an electrical and electronic apparatus or device, especially a resist developing apparatus and is as efficient as acetic acid that has been regarded as the most efficient cleaning agent for such an apparatus or a device heretofore.

Another object of the present invention is to provide a cleaning composition which does not emit an irritating smell and exert a bad influence on the environment, unlike acetic acid.

Still another object of the present invention is to provide a economical cleaning composition which can be recovered after uses and used repeatedly due to its excellent dissolving ability.

Further object of the present invention is to provide a noncorrosive cleaning composition, which can reduce the time and cost needed to maintain or repair an apparatus or device.

A cleaning composition of the present invention comprises a surfactant containing a phenyl group, a sulfonated aromatic compound, and water.

A cleaning composition of the present invention may further comprise a derivative of aliphatic carboxylic acid or acetic ester, or a combination thereof.

A method of cleaning a resist developing apparatus of the present invention comprises removing deposited contaminant adhered to the inside of the resist developing apparatus with the use of a cleaning composition comprising a surfactant containing a phenyl group, a sulfonated aromatic compound, and water.

A method of cleaning a resist developing apparatus of the present invention may optionally comprise removing deposited contaminant adhered to the hard surface of the resist developing apparatus with the use of a cleaning composition comprising a surfactant containing a phenyl group, a sulfonated aromatic compound, a derivative of aliphatic carboxylic acid, acetic ester; and water.

Preferred embodiments of the present invention will be described in detail below.

DETAILED DESCRIPTION OF THE DRAWINGS

Figure 1:
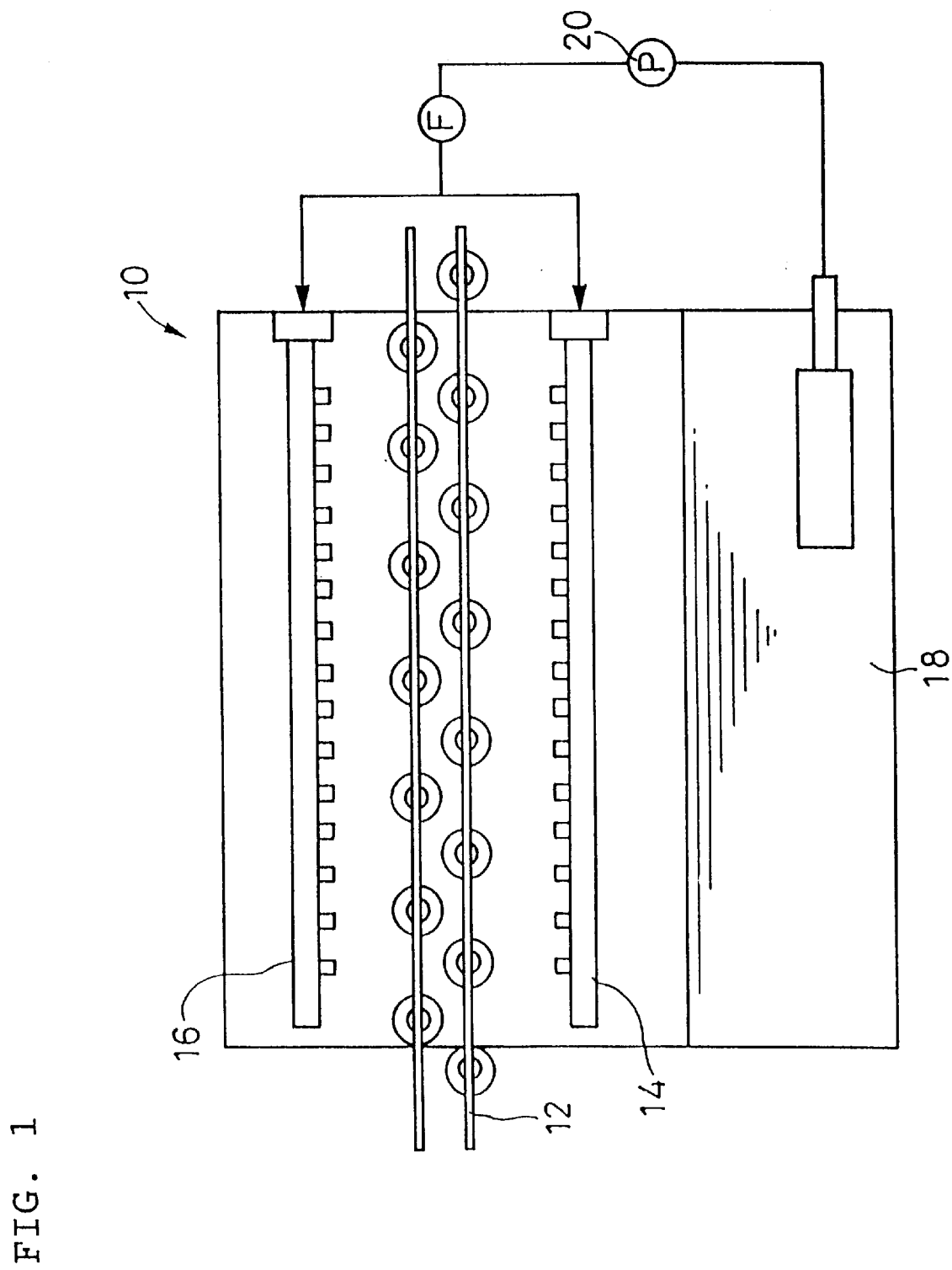
FIG. 1 is a plan view of a resist developing apparatus that can be cleaned by the cleaning composition of the present invention.

A cleaning composition of the present invention is prepared by mixing a surfactant containing a phenyl group, a sulfonated aromatic compound, and water. The composition can be prepared either at a room temperature or a temperature ranging from 30° C. to 40° C. The cleaning composition of the present invention may further comprise other ingredients. The other ingredients are preferably derivative(s) of aliphatic carboxylic acid or acetic ester, or a combination thereof. The cleaning composition can also be prepared either at a room temperature or a temperature ranging from 30° C. to 40° C. even when a derivative of aliphatic carboxylic acid or acetic ester is added to the composition. A derivative of aliphatic carboxylic acid can be easily mixed to a solution including water and a surfactant, although the order to add ingredients is not limited.

The cleaning composition of the present invention is obtained by mixing a surfactant containing a phenyl group that disperses deposited contaminants adhered to a resist developing apparatus into the composition; a sulfonated aromatic compound having in single molecule the functions of being mixed easily with the surfactant and of promoting the dissolution of the deposited contaminants in the composition; and water. A sulfonated aromatic compound contributes to dissolving deposited contaminants adhered to a resist developing apparatus, since it is highly soluble in water. Solubility of deposited contaminants in the cleaning composition is closely correlated with the acid value of the composition, which is adjusted by the concentration of the sulfonated aromatic compound contained in the composition. A sulfonated aromatic compound has also a high affinity for a surfactant containing a phenyl group. Therefore, deposited contaminants adhered to a resist developing apparatus are dissolved and dispersed in a surfactant containing a phenyl group through a sulfonated aromatic compound to be effectively incorporated in the cleaning composition.

Any kind of surfactants containing a phenyl group known to the ordinary skilled in the art can be used to prepare the cleaning composition of the present invention. Generally, such surfactants are used to disperse oils, resins, and fibers, in the art. Typical examples of surfactants containing a phenyl group are alkyleneoxide addition condensates (addition compound) of phenols, such as polyoxyalkylene-alkylphenyl ether and polyoxyalkyleneallylphenyl ether. More specifically, the surfactants include polyoxyetylene-alkyl phenyl ether containing from 6 to 15 moles of ethylene oxides in a single molecule and polyoxyethylenestyrylphenyl ether containing from 8 to 30 moles of ethylene oxides. Polyoxyethylenestyrylphenyl ether can be either mono-, di-, or tri-styryl phenol. These surfactants described above can be used solely or in a combination thereof.

Any kind of sulfonated aromatic compounds known to the ordinary skilled in the art can be used to prepare the cleaning composition of the present invention. Sulfonated aromatic compounds used in the present invention are not limited, but aromatic sulfonic acid is preferred. More specifically, benzene sulfonic acid, nitrobenzene sulfonic acid, toluene sulfonic acid, xylene sulfonic acid, naphthalene sulfonic acid and an alkaline salts thereof are preferably used, however, they can be used solely or in a combination thereof.

Water used to prepare the cleaning composition of the present invention can be tap water, deionized water, distilled water, or refined water.

Additional ingredients that swell deposited contaminants adhered to a resist developing apparatus are preferably used to effectively remove the contaminants. Since derivatives of aliphatic carboxylic acid swell the contaminants and promote the dissolution of the contaminants in the composition and acetic ester is permeable to contaminants, the time required to swell the contaminants can be shortened.

Therefore, the cleaning composition of the present invention may comprise derivatives of aliphatic carboxylic acid, as needed. Any derivative of aliphatic carboxylic acid known to the ordinary skilled in the art can be used to prepare the cleaning composition of the present invention. The derivatives of aliphatic carboxylic acid include mono-carboxylic acid, dicarboxylic acid, polycarboxylic acid, the salts of these carboxylic acids, monoester or diester of these carboxylic acids. Preferably, carboxylic acid compound having 6 or less of carbon atoms, the salts thereof, and mono or di-ester of such carboxylic acids are used. The ester compounds of dicarboxylic acid having 6 or less of carbon atoms and alcohol having 4 or less of hydroxyl groups are more preferably used, and methyl ester dicarboxylate is most preferably used. More specifically, aliphatic carboxylic acid such as oxalic acid, malonic acid, fumaric acid, maleic acid, succinic acid, itaconic acid, mesaconic acid, citraconic acid, glutaric acid, malic acid, adipic acid, tartaric acid, and citric acid; the salts thereof; or the ester thereof can be used. One of the above mentioned compounds or the combination thereof can be used.

The cleaning composition of the present invention may optionally comprise acetic ester instead of or in combination with a derivative of aliphatic carboxylic acid. Acetic esters having 10 or less carbon atoms are preferably used in the present invention. Concretely, ethyleneglycoldiethylether acetate, ethyleneglycolmonoethyl ether acetate, ethyleneglycoldibutylether acetate, ethyleneglycolmonobutyl ether acetate, ethyleneglycol monoacetate, ethyleneglycol diacetate, diethyleneglycolmonomethylether acetate, diethyleneglycolmonoethylether acetate, diethyleneglycolmonobutylether acetate, diethyleneglycoldimethyl ether acetate, diethyleneglycolmethylethylether acetate, diethyleneglycol diethylether acetate, diethyleneglycoldibutylether acetate, diethyleneglycol acetate, triethyleneglycol acetate, triethyleneglycolmonomethylether acetate, triethyleneglycolmonoethylether acetate, propyleneglycolmonomehylether acetate, propyleneglycolmonoethylether acetate, propyleneglycolmonobutylether acetate, dipropyleneglycolmonomethylether acetate, dipropylene glycol monoethyl ether acetate, glyceryl monoacetate, glyceryl diacetate, glyceryl triacetate, and the like can be used. One of the above mentioned compounds or the combination thereof can be used.

The concentration of a surfactant containing a phenyl group, a sulfonated aromatic compound, and water in the cleaning composition is not limited. Preferably, the total concentration of a surfactant containing a phenyl group and a sulfonated aromatic compound in the cleaning composition is in a range from 3.0 to 50.0% by weight. The ratio of a surfactant containing a phenyl group to a sulfonated aromatic compound is in a range from 10:1 to 1:4 by weight.

The concentration of a derivative of aliphatic carboxylic acid, which may be added to the cleaning composition as required, may be 0.03% by weight or more of the total composition and preferably in a range from 1.0 to 30.0% by weight. The concentration of acetic ester may be 0.03% by weight or more of the total composition and preferably in a range from 1.0 to 5.0% by weight. The remaining ingredients of the composition are water and a small quantity of other additives. The concentration of the ingredients in the composition may be changed depending on the amount and the state of deposited contaminant adhered to a resist developing apparatus.

The cleaning composition of the present invention may further comprise other ingredients as required. For example, a trace amount of defoaming agent can be added to the composition including low concentration of ingredients to prevent it from forming. Other additives such as preservatives, rust preventives, antioxidant, aromatizer, and the like can be added.

Uses of the cleaning composition prepared as above in the present invention are not limited. The cleaning composition may preferably be used to cleanse a resist developing apparatus of deposited contaminants, but may also be used to remove resin-rich deposited contaminants adhered to an apparatus for manufacturing various components. The cleaning composition is most preferably used to clean a resist developing apparatus for photo lithography technique that employs dry film resist or liquid type resist.

The cleaning composition of the present invention can be used in various cleaning methods, such as an immersion cleaning method, an ultrasonic cleaning method, an oscillation cleaning method, a spray cleaning method, and a wiping method. The cleaning methods for cleaning a resist developing apparatus include:

a method in which a resist developing apparatus is disassembled into components, the components are ultrasonically cleaned in an ultrasonic washing tub filled with the cleaning composition of the present invention, then the components are immersed and cleaned in the cleaning composition of the present invention, and the composition is rinsed out of components; and a method in which the cleaning composition of the present invention is sprayed on a resist developing apparatus and then the composition is wiped off without disassembling a resist developing apparatus into components. Especially, methods for cleaning a resist developing apparatus effectively include a method wherein the cleaning composition of the present invention is introduced in a tank for reserving a developing solution of a resist developing apparatus, sprayed from spray nozzles, and circulated to incorporate deposited contaminants adhered to a resist developing apparatus into the composition. Other cleaning methods which are apparent to those skilled in the art can be applied in the present invention. The embodiments of the present invention are not limited to those described herein.

The cleaning composition of the present invention is suitable for cleaning deposited contaminants adhered to a resist developing apparatus and is as effective as acetic acid that is regarded as the most effective detergent for a resist developing apparatus heretofore. The cleaning composition of the present invention does not emit an irritating smell, unlike acetic acid, thus does not adversely affect the environment. Further, the cleaning composition of the present is economical since it can be recovered and used repeatedly due to its higher dissolving ability than that of acetic acid. The cleaning composition of the present invention is not corrosive, thus time and cost needed to maintain or repair a resist developing apparatus may be reduced compared with the case in which acetic acid is used.

There has thus been described the preparation and the embodiments of uses of the present cleaning composition, but the present invention is not limited to those described herein. Various changes, modifications, variations and other uses and applications of the subject invention which do not depart from the spirit or scope of the present invention are embodied, as required.

EXAMPLES

The present invention will be described concretely below in the form of Examples. The present invention, however, is not limited to the content of the Examples. The values shown in the Tables represent a percentage by weight.

The detergency of the cleaning composition of the present invention and comparative composition are evaluated by a solubility test.

Examples 1 to 6 and Comparative Examples 1 to 5

Dry film resist (Trademark:RISTON, manufactured by E.I.du Pont de Nemours and Co.) was dissolved in a sodium carbonate solution and an insoluble precipitate was recovered. 3 g of the recovered precipitate was added to 20 ml of the composition prepared in any one of the Examples 1 to 6 and Comparative Examples 1 to 5 and each mixture was allowed to stand in a room temperature without stirring it.

The detergency of each composition was evaluated by the time needed to dissolve the precipitate. In the Table, A represents the ability to dissolve the precipitate completely in less than an hour, B represents the ability to dissolve the precipitate in a period of more than or equal to an hour but less than two hours, C represents the ability to dissolve the precipitate in a period of two hours or more but less than four hours, and D represents that it takes more than four hours to dissolve precipitate. "To dissolve the precipitate" used herein means not only the condition wherein the precipitate is dissolved completely to make a transparent solution, but also the conditions in which the precipitate is emulsified to make a emulsion and the conditions in which dissolved precipitate is deposited again.

The ability of each composition to disperse precipitate was evaluated by observing the state of each composition after dissolving the precipitate. A' represents the state of a transparent solution, B' represents the state of half-emulsion and no deposit, C' represents the state of half-emulsion with deposit, D' represents the state of emulsion with deposit, or the state in which the precipitate is not dissolved.

The content of each composition and the results of the above-mentioned evaluation are shown in Table 1. In the Table, (a) represents polyoxyethylenestyrylphenyl ether surfactant (Emulgen A60, a product of Kao Corp.), (b) represents 4-methylbenzene sulfonic acid (PTS-100, a product of Taoka Chemical Co., Ltd.), (c) represents the mixture of dimethyl glutarate, dimethyl succinate, and dimethyl adipate (DBE, a product of E.I.du Pont de Nemours and Co.), and (d) represents diethyleneglycolmonoethyl ether acetate (Ethyldiglycol acetate, a product of Daicel Chemical Industries, Ltd. ). Acetic acid used herein is prepared by diluting a product commercially available from Kanto Chemical Co., Inc.

TABLE 1

| | CONCENTRATION OF INGREDIENTS (%) | | | | | | EVALUATION | |
|---|---|---|---|---|---|---|---|---|
| | (a) | (b) | (c) | (d) | water | acetic acid | time | ability to disperse |
| Exp. 1 | 10 | 40 | 30 | 5 | 15 | | A | A' |
| Exp. 2 | 10 | 20 | 15 | 5 | 50 | | A | A' |
| Exp. 3 | 10 | 10 | 5 | 5 | 70 | | B | C' |
| Exp. 4 | 10 | 40 | 0 | 5 | 45 | | B | B' |
| Exp. 5 | 10 | 40 | 30 | 0 | 20 | | C | A' |
| Exp. 6 | 5 | 20 | 15 | 2 | 58 | | B | A' |
| Com. 1 | 10 | 0 | 30 | 5 | 55 | | D | D' |
| Com. 2 | 0 | 40 | 0 | 5 | 55 | | B | C' |
| Com. 3 | | | | | 20 | 80 | A | A' |
| Com. 4 | | | | | 40 | 60 | B | C' |
| Com. 5 | | | | | 60 | 40 | C | D' |

The detergent including acetic acid of the Comparative Examples gave a irritating smell but the composition of the present invention did not give such smell.

Example 7

With the use of 600 liters of the composition of Example 1, a resist developing apparatus was cleaned. An alkaline developing solution in a liquid reserving part 18 of the resist developing apparatus 10 was drained and the resist developing apparatus 10 was washed twice with water. Then the composition of the present invention was filled in an empty liquid reserving part 18 of the resist developing apparatus 10 with the use of a portable liquid transfer pump 20 and the composition was circulated to clean a resist developing apparatus for an hour. During circulation, liquid was sprayed from both a lower spray nozzle 14 and a upper spray nozzle 16 toward a carrier roller 12. After cleaning, the used composition was recovered in a drum and a resist developing apparatus 10 was filled with water. A resist developing apparatus was cleaned twice with water circulated in a resist developing apparatus and an alkaline solution was filled in the liquid reserving part of the resist developing apparatus again.

The used composition recovered in the drum was reserved and it was further used to clean another resist developing apparatus. The cleaning composition of the present invention has enough ability to be used even at the third time to clean a resist developing apparatus and deposited contaminants on a resist developing apparatus was removed even at the time.

During cleaning, it was not necessary to use a safety mask as the composition of the present invention gave little smell, unlike the case where acetic acid solution was used.

What is claimed is:

1. A method of cleaning a resist developing apparatus, characterized by removing deposited contaminant adhered to the developing apparatus with the use of a cleaning composition comprising:

(a) a surfactant containing a phenyl group, (b) a sulfonated aromoatic-compound, and (c) water.

2. The method of claim 1 wherein said surfactant containing a phenyl group is selected from the group consisting of polyoxyalkylenealkyphenyl ether, polyoxyalkylenestrylphenyl ether, or a combinaation thereof.

3. The method of claim 1 wherein said sulfonated aromatic compound is aromatic sulfonic acid or an alkaline salt thereof.

4. The method of claim 3, wherein said aromatic sulfonic acid is at least one selected from the group consisting of benzene sulfonic acid, nitrobenzene sulfonic acid, toluene sulfonic acid, xylene sulfonic acid, nitrobenzene sulfonic acid, and an alkaline salt thereof.

5. The method of claim 1 wherein said cleaning composition further comprises a derivative of aliphatic carboxylic acid.

6. The method of claim 5, wherein said derivative of aliphatic carboxylic acid is aliphatic dicarboxylic methyl ester.

7. The method of claim 1 wherein said cleaning composition further comprises acetic ester.

* * * * *